(12) United States Patent
Hubner et al.

(10) Patent No.: US 6,225,559 B1
(45) Date of Patent: May 1, 2001

(54) HEAT-INSULATED HOUSING TO ACCOMMODATE ELECTRICAL OR ELECTRONIC COMPONENTS

(75) Inventors: Karsten Hubner; Martin Diehl, both of Aerzen (DE)

(73) Assignee: Lenze GmbH & Co., Aerzen (DE)

( * ) Notice: Subject to any disclaimer, the term of this patent is extended or adjusted under 35 U.S.C. 154(b) by 0 days.

(21) Appl. No.: 09/230,473

(22) PCT Filed: May 27, 1998

(86) PCT No.: PCT/EP98/03112

§ 371 Date: Mar. 10, 1999

§ 102(e) Date: Mar. 10, 1999

(87) PCT Pub. No.: WO98/54940

PCT Pub. Date: Dec. 3, 1998

(30) Foreign Application Priority Data

May 30, 1997 (DE) .............................. 197 22 602

(51) Int. Cl.$^7$ .................... H02G 3/08; H05K 5/00
(52) U.S. Cl. .................... 174/52.1; 257/719; 361/718; 361/719

(58) Field of Search .................. 257/718, 719; 174/52.1; 361/704, 714, 718, 719; 165/80.2

(56) References Cited

U.S. PATENT DOCUMENTS

| 5,309,979 | * | 5/1994 | Brauer ............... 165/80.2 |
| 5,321,582 | * | 6/1994 | Casperson ........... 361/713 |
| 5,959,839 | * | 9/1999 | Gates ................ 361/704 |

* cited by examiner

*Primary Examiner*—Anthony Dinkins
*Assistant Examiner*—Hung V Ngo
(74) *Attorney, Agent, or Firm*—Charles E. Baxley

(57) ABSTRACT

A heat transfer housing for a printed circuit board, which has an electrical component having a thermal contact area, includes an extruded section having a contact area and contours for receiving the printed circuit board. One of the walls of the housing is initially formed displaced outwardly through an angle. When the printed circuit board is installed in the housing, the outwardly displaced wall is rotated inwardly and held in place by a cover. The wall includes a portion which bears against the printed circuit board and forces the thermal contact area of the electrical component to bear against the contact area of the housing for efficient heat transfer.

19 Claims, 2 Drawing Sheets

HEAT-INSULATED HOUSING TO ACCOMMODATE ELECTRICAL OR ELECTRONIC COMPONENTS

FIELD OF THE INVENTION

The present invention relates generally to the field of housings and, more particularly, to a heat-dissipating housing for electrical or electronic components.

PRIOR ART

The prior art related to housings for semiconductors having thermal contact elements which are connected to the inside of the housing for the purpose of heat dissipation includes German Patent Application DE 36 29 552 A1. In order to attain reliable heat transfer, the semiconductor components are screwed to one of the side portions of a U-section. Instead of the screw joint, spring pressure elements may also be provided as is shown in German Patent DE 92 13 671 U1. It is also known to solder correspondingly constructed power semiconductors to heat sinks.

In general, the known connecting techniques for establishing a thermal contact in a housing require, irrespective of whether they function in a mechanical-force locking manner or in a manner connected by a material joint, result in an increased outlay in terms of components and assembly cost with the consequent risk of additional fault sources being introduced in the design.

OBJECTS AND SUMMARY OF THE INVENTION

It is therefore an object of the present invention to provide a heat-dissipating housing for electrical or electronic components which equipped with at least one printed circuit board on which electrical or electronic components are mounted and having a portion which can be deformed or moved in a way such that thermal contact between the electrical or electronic components can be established without the need for assembly of any additional parts.

Another object of the present invention is to provide a heat-dissipating housing which can be manufactured economically as a unitary structure.

The foregoing and other objects and advantages of the present invention will appear more clearly hereinafter. In accordance with the present invention there is provided a heat-dissipating housing for electrical or electronic components which consists of a light-metal section preferably on three peripheral sides which has at least one side which either is already integrally formed in a displaced fashion or rotated in the course of extrusion or which can be displaced by being bent in the course of assembly. After the introduction of the populated printed circuit board with the electronic or electrical components which are mounted thereon and which have respective thermal contact elements, the displaced side is rotated into a final or installed position which is generally perpendicular to the base of the housing.

Thermal contact between the thermal contact elements of the relevant components on the printed circuit board and a contact area inside the housing is established, at the same time, by the rotated side of the housing pressing the thermal contact elements of the components against a heat-dissipating contact area on the housing either directly or indirectly via an intermediate element. For this purpose the geometrical dimensions are chosen such that the contact pressure obtained is one which minimizes the thermal contact resistance between the thermal contact elements of the components to be cooled and the contact area inside the housing. At the same time, this thermal contact can additionally be utilized to produce potential equalization between the printed circuit board and the housing with corresponding potential equalization protective contacts.

DESCRIPTION OF THE DRAWINGS

Other important objects and advantages of the present invention will be apparent from the following detailed description taken in connection with the accompanying drawings wherein like numerals refer to like parts and in which.

DETAILED DESCRIPTION OF THE INVENTION

With reference to the drawings, wherein like reference numbers designate like or corresponding parts throughout, there is shown in FIGS. 1–4 a heat-dissipating housing 100 for electrical or electronic components, made in accordance with the present invention.

Figure 1:
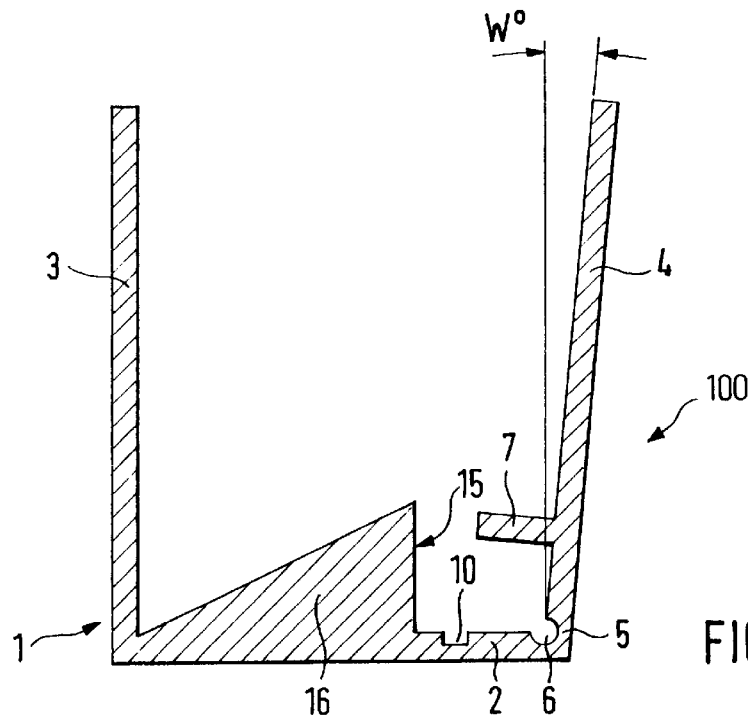
FIG. 1 is a cross-sectional view of a heat-dissipating housing for electrical or electronic components with the housing cover shown removed.

FIG. 1 shows an essentially U-shaped extruded section 1 composed of light metal, such as aluminum. Section 1 can be referred to as a box section because it constitutes the basis for a box-type housing which has the shape of a cuboid or of a parallelepiped and consequently, after the insertion of end sides all around, is closed by four sides each at right angles to one another.

The U-shaped box section 1 has a base side 2 and flange sides 3, 4 integrally formed in one piece longitudinally on said base side 2, the left-hand flange side 3 in the illustration being oriented at right angles to the base side 2. The right-hand flange side 4 of the U-section 1 is displaced somewhat outwardly in the starting position shown in FIG. 1 and is at a slightly obtuse angle with respect to the base side 2. As a result, a very acute angle W is produced between the perpendicular to the base side 2 and the planar flange side 4. The angular position of the flange side 4 relative to the base side 2 can either be provided in the course of extrusion or it can be produced by subsequent deformation in the transition region between these two sides 2 and 4.

The displaced flange side 4 can be connected to the base side 2 via a cross-sectionally weakened wall portion 5, for which purpose a continuous indentation 6 is made in the inner corner between the flange side 4 and the base side 2. The wall portion 5 in the transition region can thus assume the function of a plastically deformable film hinge and, for the purpose of elimination or resetting of the angle W of inclination, permits the flange side 4 to be pressed in the direction toward the interior of the U-section 1, with the result that the flange side 4, in its final position, lies parallel to the second flange side 3 of the U-section 1.

Figure 2:
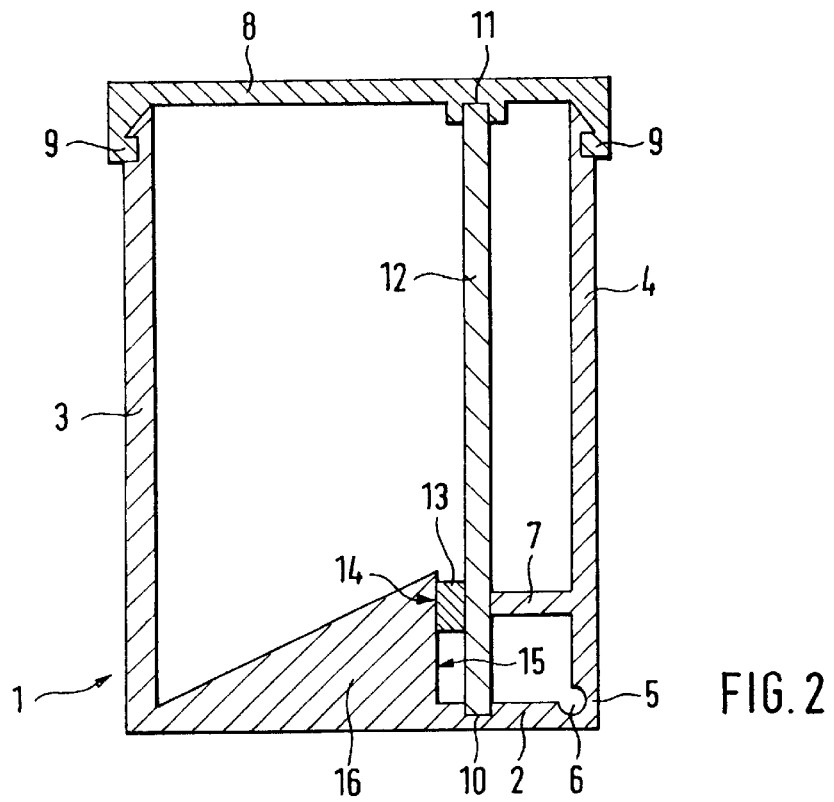
FIG. 2 is a cross-sectional view similar to FIG. 1 showing a printed circuit card installed in the housing and showing the cover in place.

In the region lying toward the base side 2 the flange side 4 has on its inner side a projecting pressure part 7 in the shape of a transverse web, the function of which is shown in FIG. 2.

An inwardly directed projection 16 having a triangular cross-section is formed on the base side 2, which projection is integrally formed in one piece. The shorter side of this triangular cross-section forms a contact area 15, the function of which will be explained with reference to FIG. 2. This contact area 15, which is perpendicular to the base side 2, has to resist a mechanical pressure which is applied up near the upper edge of the projection 16 at the level of the pressure part 7 on the flange side 4. For this reason too the cross section of the projection 16 on the side remote from the contact area 15 gradually decreases down to the base side 2.

FIG. 1 additionally shows a groove 10 which is formed in the base side 2 on the inside of the housing 100 at a relatively short distance in front of the contact area 15 of the projection 16. As is further shown in FIG. 2, in this regard, a printed circuit board 12 can be inserted into this groove 10. The printed circuit board 12 may be populated with a multiplicity of electrical or electronic components for which there is space inside the U-section 1 but which are not represented in the drawing. This is because the electronic components of concern here are primarily those electronic components 13, such as power semiconductors, which are equipped with thermal contact elements 14 on the housing side or housing area of the respective component 13. When the printed circuit board 12 is inserted, these components 13 are arranged proximate to the base side 2 of the U-section 1 at the level of the pressure part 7 which is formed on the flange side 4.

During the insertion of the printed circuit board 12, the pressure part 7 initially maintains a distance from the printed circuit board 12 as a result of the inclined starting position of the flange side 4. Once the printed circuit board 12 is seated in the predetermined installed position, the initially inclined flange side 4 of the U-section 1 is directed, that is to say is brought into the position perpendicular to the base side 2 and parallel to the opposite flange side 3 by being pivoted about the deformable wall portion 5 in the transition region, which consequently forms the pivot axis. After this, the pressure part 7 on the inside of the flange side 4 bears upon the printed circuit board 12 at the level of the components 13, or rather their thermal contact elements 14, but on the side remote from the components. As a result, the thermal contact elements 14 of the components 13 are pressed against the contact area 15 situated on the projection 16 of the base side 2, whereby there is very good thermal contact for dissipating the heat loss from the components 13 into the projection 16 on the base side 2 and thus into the entire U-section 1. Electrical potential equalization between the printed circuit board 12 and the U-section 1 can also be produced in the same way.

The housing side situated opposite the base side 2 of the U-section 1 is formed by a covering hood 8 which has a groove 11 between two webs on its inner side, the groove 11 being situated opposite the groove 10 in the base side of the U-section 1 in such a way that the printed circuit board 12, in parallel alignment with the directed flange side 4, can engage therein for the purpose of further mechanical securing. The covering hood 8 engages over both flange sides 3 and 4 on their outer sides, the covering hood 8 and the flange sides 3 and 4 having latching elements 9 that correspond with one another in the overlap region, in order that the covering hood 8 can be latched onto the open housing in a simple manner.

Figure 3:
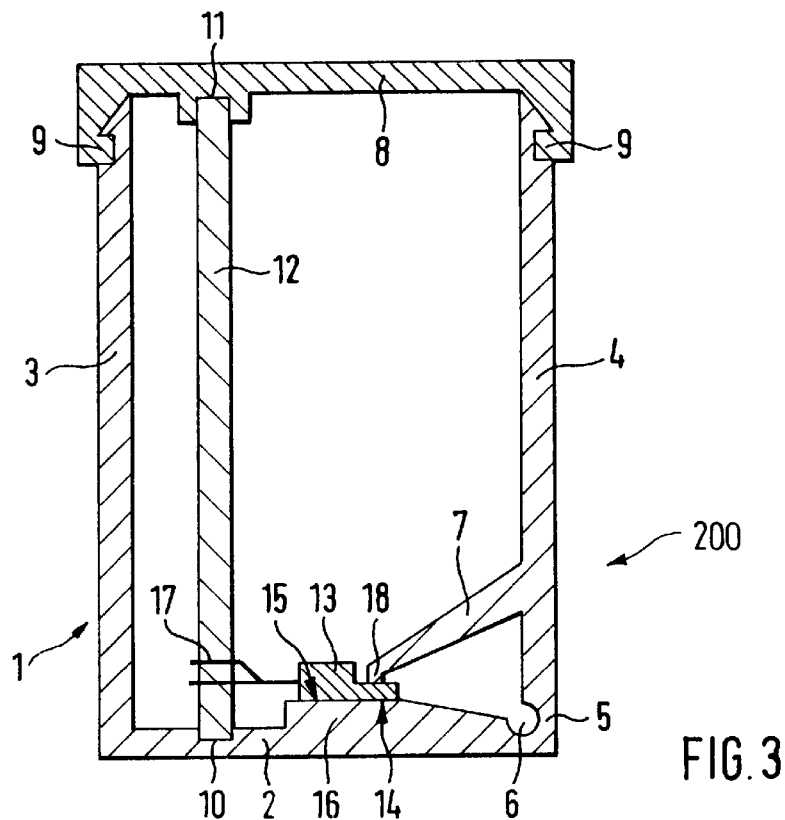
FIG. 3 is a cross-sectional view similar to FIG. 2 showing an alternative embodiment of the present invention.

FIG. 3 shows an alternative embodiment of the present invention 200, the external structure of which is generally similar to the structure of FIG. 2. The embodiment 200 incorporates a pressure component 7' on the flange side 4' which can act directly on the component 13' and brace the component against the projection 16' on the base side 2. Component 13' is connected via lengthened connecting lugs 17 to the printed circuit board 12, which is arranged near the non-directable flange side 3 and is also parallel thereto. The contact area 15' of the projection 16' on the base side 2' extends in a plane perpendicular to the flange side 3 as well as to the directed flange side 4'. In FIG. 3 the pressure part 7' on the directable flange side 4' functions as a lever and acts upon the component 13' on the top side remote from the base side 2' of the U-section 1. When the directable flange side 4' is pivoted, a torque is produced at the end of the pressure part 7'. The torque generates the pressure force by which the thermal contact element 14' on the component 13' is braced against the contact area 15'. In order to keep the bending stresses in the pressure part 7' on the directable flange side 4' within limits, the pressure part 7' is arranged on the inside of the directable flange side 4' in such a way that it is arranged in a manner inclined toward the component 13' when the flange side 4' is in the directed end position. Moreover, it is also possible to provide an angular portion 18 on that end of the pressure part 7' which acts upon the component 13', the angular portion being directed perpendicularly to the thermal contact element 14' of the component 13' and perpendicularly to the contact area 15' on the projection 16' of the base side 2.

Figure 4:
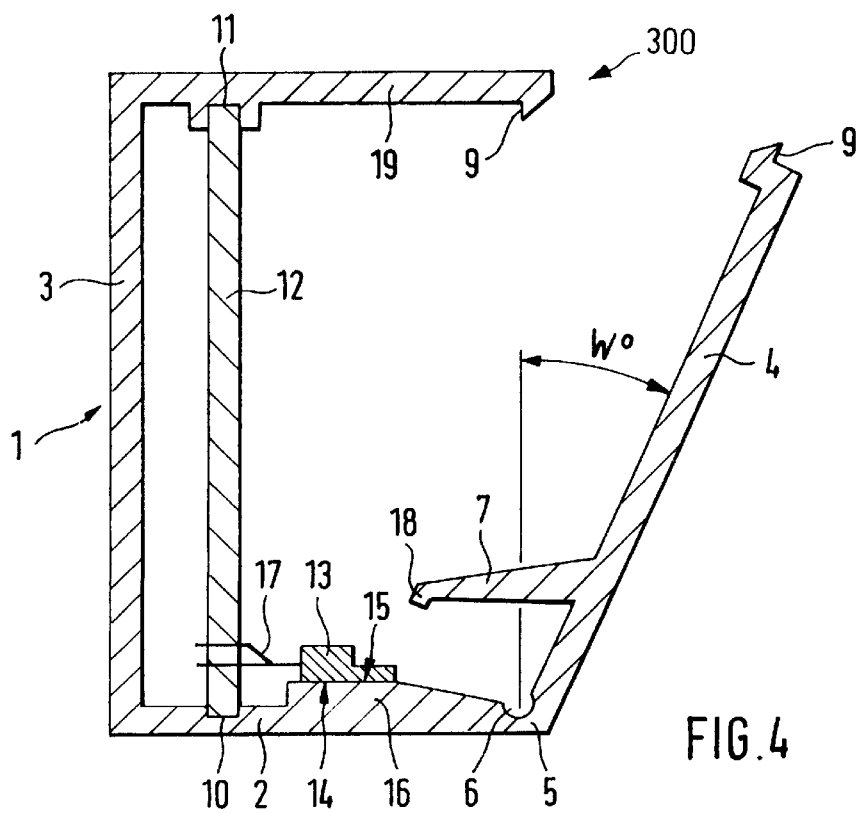
FIG. 4 is a cross-sectional view similar to FIG. 2 showing another embodiment of the invention.

FIG. 4 shows another alternative embodiment of the invention 300 which is generally similar to the embodiment 200 of FIG. 3.

The component 13' to be cooled is acted upon directly in order to brace it against the contact area 15' in the housing. In FIG. 4, however, the extruded section forming the box section 1 is constructed such that it is essentially C-shaped, which means that the fourth peripheral side 19 is integral with the remaining peripheral sides. Thus, in this case too, there is a base side 2, a first side 3 situated at right angles thereto, the side 4' arranged in a directable manner on the base side, and a covering side 19 opposite the base side 2. In principle, the covering side 19 of the C-shaped box section 1 replaces the covering hood 8 of the U-shaped box section 1 according to the previous figures. Accessibility to the interior of the C-shaped box section 1 is ensured by a correspondingly large opening angle W of the directable side 4'. For the rest, the pivoting of the directable side 4' with the simultaneous production of the heat-dissipating contact for the component 13' is affected in the same way as in the designs described above in connection with FIG. 3.

In FIG. 4 the directable side 4' can be latched to the covering side 19 and latching means 9' are correspondingly present on the free ends of the directable side 4' and of the covering side 19. Consequently, the covering hood 8, that can be attached separately, can be omitted in this design.

The foregoing specific embodiments of the present invention, as set forth in the specification herein, are for illustrative purposes only. Various deviations and modifications can be made within the spirit and scope of this invention, without departing from the main theme thereof.

What is claimed is:

1. A heat-dissipating housing for a printed circuit board comprising:
   a printed circuit board having at least one electrical component mounted thereon, said electrical component having a thermal contact element;
   a base portion;
   a thermal contact portion formed on said base portion;
   a printed circuit board retainer portion, formed on said base portion;

a first side portion projecting from said base portion;

a second side portion projecting from said base portion, said second side portion having a starting position in which said second side portion is rotated outwardly away from said first side portion through a selected angle relative to said first side portion and an installed position in which said second side portion is rotated inwardly toward said first side portion and in which said second side portion bears against said printed circuit board installed in said printed circuit board retainer portion, thereby urging said electrical component mounted on said printed circuit board to bear against said thermal contact portion formed on said base portion.

2. The heat-dissipating housing as claimed in claim 1, further comprising:

a film hinge disposed connecting said second side portion and said base portion.

3. The heat-dissipating housing as claimed in claim 1, further comprising:

a projecting pressure part disposed on said second side portion.

4. The heat-dissipating housing as claimed in claim 3, wherein said projecting pressure part bears on said printed circuit board when said second side is in said installed position.

5. The heat-dissipating housing as claimed in claim 1, wherein said thermal contact portion is formed on a portion projecting from side base.

6. The heat-dissipating housing as claimed in claim 1, wherein said thermal contact element of said electrical component is disposed facing away from said second side portion.

7. The heat-dissipating housing as claimed in claim 1, wherein said electrical component is disposed toward said second side portion and wherein said thermal contact element of said electrical component is disposed substantially perpendicular to said second side portion.

8. The heat-dissipating housing as claimed in claim 1, wherein said thermal contact portion comprises a projecting portion integrally formed on said base portion.

9. The heat-dissipating housing as claimed in claim 1, wherein said printed circuit board is substantially parallel to said second side portion when said second side portion is in said installed position.

10. The heat-dissipating housing as claimed in claim 1, wherein said thermal contact element of said electrical component is disposed proximate to said base portion.

11. The heat-dissipating housing as claimed in claim 1, wherein said thermal contact portion comprises:

a contact surface, with said contact surface substantially parallel to said printed circuit board and substantially parallel to said thermal contact element on said electrical component.

12. The heat-dissipating housing as claimed in claim 11, wherein said thermal contact portion has a cross-section which increases in size toward said contact surface.

13. The heat-dissipating housing as claimed in claim 1, wherein said thermal contact portion formed on said base portion is generally perpendicular to said first side portion and said second side portion when said second side portion is in said installed position and further comprising:

a pressure portion formed on said second side portion with said pressure portion formed at an inclination to said thermal contact portion when said second side portion is in said installed position.

14. The heat-dissipating housing as claimed in claim 1, wherein said base portion, said first side portion and said second side portion form a "U" configuration and further comprising:

upper ends on said first and said second side portions;

a cover member disposed engaging said first and said second side portions and covering said upper ends of said first and said second side portions;

said cover member having a printed circuit board retainer portion.

15. The heat-dissipating housing as claimed in claim 14, further comprising:

latching means disposed connecting said cover member and said first side portion and connecting said cover member and said second side portion.

16. The heat-dissipating housing as claimed in claim 1, wherein said base portion, said first side portion and a cover member form an integrally formed "C" configuration when viewed in cross-section, and said cover member has an angled latching portion for connection to said second side portion.

17. The heat dissipating housing as claimed in claim 16, wherein a printed circuit board retainer portion on said cover member and said printed circuit board retainer portion on said base portion comprise mutually opposite groove portions.

18. A heat-dissipating housing for a printed circuit board comprising:

a printed circuit board having at least one electrical component mounted thereon, said electrical component having a thermal contact element;

a base portion;

a thermal contact portion formed on said base portion;

a printed circuit board retainer portion, formed on said base portion;

a first side portion projecting from said base portion;

a second side portion projecting from said base portion, said second side portion having a starting position in which said second side portion is rotated outwardly away from side first side portion through a selected angle relative to said first side portion and an installed position in which said second side portion is rotated inwardly toward said first side portion and in which said second side portion bears against an electrical component on said printed circuit board installed in said printed circuit board retainer portion, thereby urging said electrical component mounted on said printed circuit board to bear against said thermal contact portion formed on said based portion.

19. The heat-dissipating housing as claimed in claim 18, wherein said second side portion is disposed to bear on said electrical component and thereby urge said thermal contact element of said electrical component to bear against said thermal contact portion formed on said base portion.

\* \* \* \* \*